US010290679B1

(12) United States Patent
Bhushan et al.

(10) Patent No.: US 10,290,679 B1
(45) Date of Patent: May 14, 2019

(54) HIGH-DENSITY STT-MRAM WITH 3D ARRAYS OF MTJS IN MULTIPLE LEVELS OF INTERCONNECTS AND METHOD FOR PRODUCING THE SAME

(71) Applicant: GLOBALFOUNDRIES Singapore Pte. Ltd., Singapore (SG)

(72) Inventors: Bharat Bhushan, Singapore (SG); Juan Boon Tan, Singapore (SG); Yi Jiang, Singapore (SG); Danny Pak-Chum Shum, Singapore (SG); Wanbing Yi, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/917,084

(22) Filed: Mar. 9, 2018

(51) Int. Cl.
| H01L 27/22 | (2006.01) |
| G11C 11/16 | (2006.01) |
| H01L 43/12 | (2006.01) |
| H01L 43/02 | (2006.01) |
| H01L 43/08 | (2006.01) |

(52) U.S. Cl.
CPC ............ *H01L 27/226* (2013.01); *G11C 11/16* (2013.01); *H01L 43/02* (2013.01); *H01L 43/08* (2013.01); *H01L 43/12* (2013.01)

(58) Field of Classification Search
CPC ....... H01L 27/226; H01L 43/02; H01L 43/08; H01L 43/12; G11C 11/16

USPC .......................................................... 365/158
See application file for complete search history.

(56) References Cited

U.S. PATENT DOCUMENTS

| 6,365,419 | B1 | 4/2002 | Durlam et al. |
| 6,590,290 | B1 | 7/2003 | Cronin et al. |
| 8,324,698 | B2 | 12/2012 | Zhong et al. |
| 9,070,869 | B2 | 6/2015 | Jung et al. |
| 10,026,779 | B2 * | 7/2018 | Sanuki .................. H01L 27/228 |
| 10,056,266 | B2 * | 8/2018 | Dieny ..................... H01L 45/06 |
| 10,068,945 | B2 * | 9/2018 | Kalnitsky .............. H01L 43/12 |

* cited by examiner

Primary Examiner — Fernando Hidalgo
(74) Attorney, Agent, or Firm — Ditthavong & Steiner P. C.

(57) ABSTRACT

A scalable method of forming an integrated high-density STT-MRAM with a 3D array of multi-level MTJs and the resulting devices are provided. Embodiments include providing a Si substrate of an X-density STT-MRAM having an array of interconnect stacks; forming a level of a MTJ structure on each of a first interconnect stack and a second interconnect stack, wherein (X−1) defines a number of interconnect stacks between the first and the second interconnect stacks; forming a via on each interconnect stack without a MTJ structure; forming a metal layer on each MTJ structure and via on the level; repeating the forming of the MTJ structure, the via, and the metal layer one interconnect stack laterally shifted until the level of the MTJ structure equals X, only forming the MTJ structure at that level; forming a bit line over the substrate; and connecting the bit line to each MTJ structure.

20 Claims, 15 Drawing Sheets

US 10,290,679 B1

HIGH-DENSITY STT-MRAM WITH 3D ARRAYS OF MTJS IN MULTIPLE LEVELS OF INTERCONNECTS AND METHOD FOR PRODUCING THE SAME

TECHNICAL FIELD

The present disclosure relates to memory design for semiconductor devices. The present disclosure is particularly applicable to spin-transfer torque magnetoresistive random-access memory (STT-MRAM).

BACKGROUND

Cell scaling is of critical importance to continued improvement of complementary metal-oxide-semiconductor (CMOS) technology. One area of increasing demand is high-density STT-MRAM. For simplicity, density is referred herein as linear density by default. If required, areal density can be computed by squaring the linear density.

A known solution to scale and, therefore, double the density of a STT-MRAM structure is to divide the magnetic tunnel junction (MTJ) pitch (P) of a two-dimensional (2D) array of MTJs in half (P/2), e.g., scaling between a 1 gigabit (1 Gb) 28 nanometer (nm) STT-MRAM and a 2 Gb 14 nm STT-MRAM, as depicted in FIGS. 1 and 2, respectively.

Referring to FIG. 1 (a cross-sectional view), a known 1 Gb (28 nm) STT-MRAM structure 100 includes a silicon (Si) substrate 101 with an active area (RX) (not shown for illustrative convenience) and an array of interconnect structures 103 and 105. In this instance, a bottom portion of each interconnect structure 103 and 105 includes a source/drain contact (CA) 107, a metal layer 109 (M1), a via 111 (V1), a metal layer 113 (M2), a via 115 (V2), and a metal layer 117 (M3). The STT-MRAM structure 100 also includes a pair of word line (WL) 119 over the Si substrate 101 between the interconnect structures 103 and 105, a transistor common 121, and a WL contact 123, e.g., W0. Further, the STT-MRAM structure 100 includes a MTJ structure 125 made up of a bottom via 127, a MTJ stack 129, and a top via 131 on each of the interconnect stacks 103 and 105, and a bit line 133 over the Si substrate 101 and on the MTJ structures 125. The P of the STT-MRAM 100 is represented by the arrow 135.

Referring to FIG. 2 (a cross-sectional view) a known 2 Gb (14 nm) STT-MRAM structure 200 includes a Si substrate 201 with an RX (not shown for illustrative convenience) and an array of interconnect structures 203, 205, 207, and 209. In this instance, a bottom portion of each interconnect structure 203, 205, 207, and 209 includes a CA 211, a metal layer 213 (M1), a via 215 (V1), a metal layer 217 (M2), a via 219 (V2), and a metal layer 221 (M3). The STT-MRAM structure 200 also includes a pair of WL 223 over the Si substrate 201 between each pair of interconnect structures, e.g., 203 and 205, a transistor common 225, and a WL contact 227, e.g., WL2, WL1, WL0. Further, the STT-MRAM structure 200 includes a MTJ structure 229 made up of a bottom via 231, a MTJ stack 233, and a top via 235 on each of the interconnect stacks 203, 205, 207, and 209, and a bit line 237 over the Si substrate 201 and on each of the MTJ structures 229. The P of the STT-MRAM structure 200 is represented by the arrow 239. However, this known solution is problematic due to the process challenges that result from dividing the P 133 of FIG. 1 in half in the STT-MRAM structure 200 such as MTJ etching leading to partial shorts; degradation in bit error rate (BER) yield; patterning complexities; dielectric gap-fill issues; inability to scale at advanced technology nodes, e.g., 7 nm; capital and tool costs; and multiple patterning costs.

A need therefore exists for methodology enabling formation of a high-density STT-MRAM without scaling the MTJ pitch or the process challenges associated with the known solution and the resulting device.

SUMMARY

An aspect of the present disclosure is a scalable method of forming an integrated high-density STT-MRAM with a three-dimensional (3D) array of multi-level MTJs.

Another aspect of the present disclosure is a 2 Gb (14 nm) high-density STT-MRAM device with a 3D array of multi-level MTJs.

A further aspect of the present disclosure is a 4 Gb (7 nm) high-density STT-MRAM device with a 3D array of multi-level MTJs.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a Si substrate of an X-density having an array of interconnect stacks; forming a level of a MTJ structure on each of a first interconnect stack and a second interconnect stack, wherein (X−1) defines a number of interconnect stacks between the first interconnect stack and the second interconnect stack; forming a via with a height of the MTJ structure on each interconnect stack without a MTJ structure; forming a metal layer on each MTJ structure and via on the level; repeating the forming of the MTJ structure, the via, and the metal layer one interconnect stack laterally shifted until the level of the MTJ structure equals X, only forming the MTJ structure at that level; forming a bit line over the substrate; and connecting the bit line to each MTJ structure.

Aspects of the present disclosure include forming the MTJ structure by: forming a bottom via on each of the first interconnect stack and the second interconnect stack; forming a MTJ stack on the bottom via; and forming a top via on the MTJ stack. Other aspects include forming the bottom via, the top via, the via, and the metal layer of copper (Cu), tungsten (W), or cobalt (Co). Further aspects include connecting the bit line to each MTJ structure by: forming a second via of Cu, W, or Co between the bit line and the metal layer. Another aspect includes connecting the bit line to each MTJ structure by: forming a second via of Cu, W, or Co with a height of the MTJ structure on each metal layer; forming a second metal layer of Cu, W, or Co on each second via; and repeating the forming of the second via and the second metal layer until each second via is on the level of the MTJ structure that equals X, only forming the second via at that level. Additional aspects include connecting the bit line to each MTJ structure by: forming a through via contact of Cu, W, or Co between each metal layer and the bit line.

Another aspect of the present disclosure is a device including: an array of interconnect stacks, laterally separated, over a Si substrate of a STT-MRAM; a first MTJ structure on each of a first interconnect stack and a second interconnect stack, wherein the first interconnect stack and the second interconnect stack are separated by a third interconnect stack; a via with a height of the first MTJ structure on each of the third interconnect stack and a fourth interconnect stack, wherein the third interconnect stack and the fourth interconnect stack are separated by the second interconnect stack; a metal layer on each first MTJ structure and via; a second MTJ structure on the metal layer of each of the third interconnect stack and the fourth interconnect stack, wherein the third interconnect stack and the fourth interconnect stack are separated by the second interconnect stack; a second via with a height of the second MTJ structure on the metal layer of each of the first interconnect stack and the second interconnect stack; and a bit line over the substrate and on the second via and the second MTJ structure.

Aspects of the device include a pair of word lines, laterally separated, over the Si substrate between a pair of interconnect stacks of the array; a transistor common over the Si substrate between the pair of word lines; and a word line contact over the transistor common. Other aspects include a bottom portion of the interconnect stack including: a CA over the substrate; a second metal layer over the CA; a third via over the second metal layer; a third metal layer over the third via; a fourth via over the third metal layer; and a fourth metal layer over the fourth via. Further aspects include the first MTJ structure and the second MTJ structure each including: a bottom via on the fourth metal layer of each of the first interconnect stack and the second interconnect stack and on the metal layer of each of the third interconnect stack and the fourth interconnect stack, respectively; a MTJ stack on the bottom via; and a top via on the MTJ stack. Additional aspects include the via, the metal layer, the second via, the second metal layer, the third via, the third metal layer, the fourth via, the fourth metal layer, the bottom via, and the top via being Cu, W, or Co. Another aspect includes the device being a 2 Gb integrated high-density 3D STT-MRAM structure with a 3D array of multi-level MTJ interconnect structures.

A further aspect of the present disclosure is a device including: an array of a first interconnect stack through an eighth interconnect stack, laterally separated, over a Si substrate of a STT-MRAM; a first MTJ structure on each of the first interconnect stack and the fifth interconnect stack; a first via with a height of the first MTJ structure on each of a second interconnect stack, a third interconnect stack, a fourth interconnect stack, a sixth interconnect stack, a seventh interconnect stack, and the eighth interconnect stack; a first metal layer on each first MTJ structure and first via; a second MTJ structure on the first metal layer of each of the second interconnect stack and the sixth interconnect stack; a second via with a height of the second MTJ structure on each of the third interconnect stack, the fourth interconnect stack, the seventh interconnect stack, and the eighth interconnect stack; a second metal layer on each second MTJ structure and second via; a third MTJ structure on the second metal layer of each of the third interconnect stack and the seventh interconnect stack; a third via with a height of the third MTJ structure on each of the fourth interconnect stack and the eighth interconnect stack; a third metal layer on each third MTJ structure and third via; a fourth MTJ structure on the third metal layer of each of the fourth interconnect stack and the eighth interconnect stack; and a bit line over the substrate and on to the fourth pair of MTJ structures.

Aspects of the device include a pair of word lines, laterally separated, over the Si substrate between a pair of interconnect stacks of the array; a transistor common over the Si substrate between the pair of word lines; and a word line contact over the transistor common. Other aspects include a bottom portion of the interconnect stack further including: a CA over the substrate; a fourth metal layer over the CA; a fourth via over the fourth metal layer; a fifth metal layer over the fourth via; a sixth via over the fifth metal layer; and a six metal layer over the six via. Further aspects include each of the first MTJ structure, the second MTJ structure, the third MTJ structure, and the fourth MTJ structure including: a bottom via on the sixth metal layer, the first metal layer, the second metal layer, and the third metal layer, respectively; a MTJ stack on the bottom via; and a top via on the MTJ stack. Additional aspects include the first via, the first metal layer, the second via, the second metal layer, the third via, the third metal layer, the fourth via, the fourth metal layer, the fifth via, the fifth metal layer, the sixth via, the sixth metal layer, the bottom via, and the top via being Cu, W, or Co. Another aspect includes a fourth via with a height of the second MTJ structure on the first metal layer of each of the first interconnect stack and the fifth interconnect stack; a fourth metal layer on the fourth via; a fifth via with a height of the third MTJ structure on the fourth metal layer of each of the first interconnect stack and the fifth interconnect stack and on the second metal layer of each of the second interconnect stack and the sixth interconnect stack; a fifth metal layer on the fifth via; and a sixth via with a height of the fourth MTJ structure on the fifth metal layer of each of the first interconnect stack, the second interconnect stack, fifth interconnect stack, and sixth interconnect stack and on the third metal layer of each of the third interconnect stack, the fourth interconnect stack, and the seventh interconnect stack, wherein the fourth via, the fourth metal layer, the fifth via, the fifth metal layer, and the sixth via are Cu, W, or Co. Additional aspects include a through via contact on the first metal layer of each of the first interconnect stack and the fifth interconnect stack, on the second metal layer of each of the second interconnect stack and the sixth interconnect stack, and on the third metal layer of each of the third interconnect stack and the seventh interconnect stack, wherein the through via contact is Cu, W, or Co. Other aspects include the device being a 4 Gb integrated high-density 3D STT-MRAM structure with a 3D array of multi-level MTJ interconnect structures.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of MTJ pitch scaling limitations; MTJ etching/partial shorts; degraded BER yield; patterning complexities; dielectric gap-fill issues; inability to scale at advanced technology nodes; capital and tool costs; and multiple patterning costs attendant upon forming and scaling a high-density STT-MRAM. The problems are solved, inter alia, by forming an integrated high-density 3D STT-MRAM structure with a 3D array of multi-level MTJ interconnect structures.

Methodology in accordance with embodiments of the present disclosure includes providing a Si substrate of an X-density STT-MRAM having an array of interconnect stacks. A level of a MTJ structure is formed on each of a first interconnect stack and a second interconnect stack, wherein (X−1) defines a number of interconnect stacks between the first interconnect stack and the second interconnect stack. A via is formed with a height of the MTJ structure on each interconnect stack without a MTJ structure. A metal layer is formed on each MTJ structure and via on the level. The forming of the MTJ structure, the via, and the metal layer is repeated one interconnect stack laterally shifted until the level of the MTJ structure equals X, only the MTJ structure is formed at that level. A bit line is formed over the substrate; and the bit line is connected to each MTJ structure.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 3:
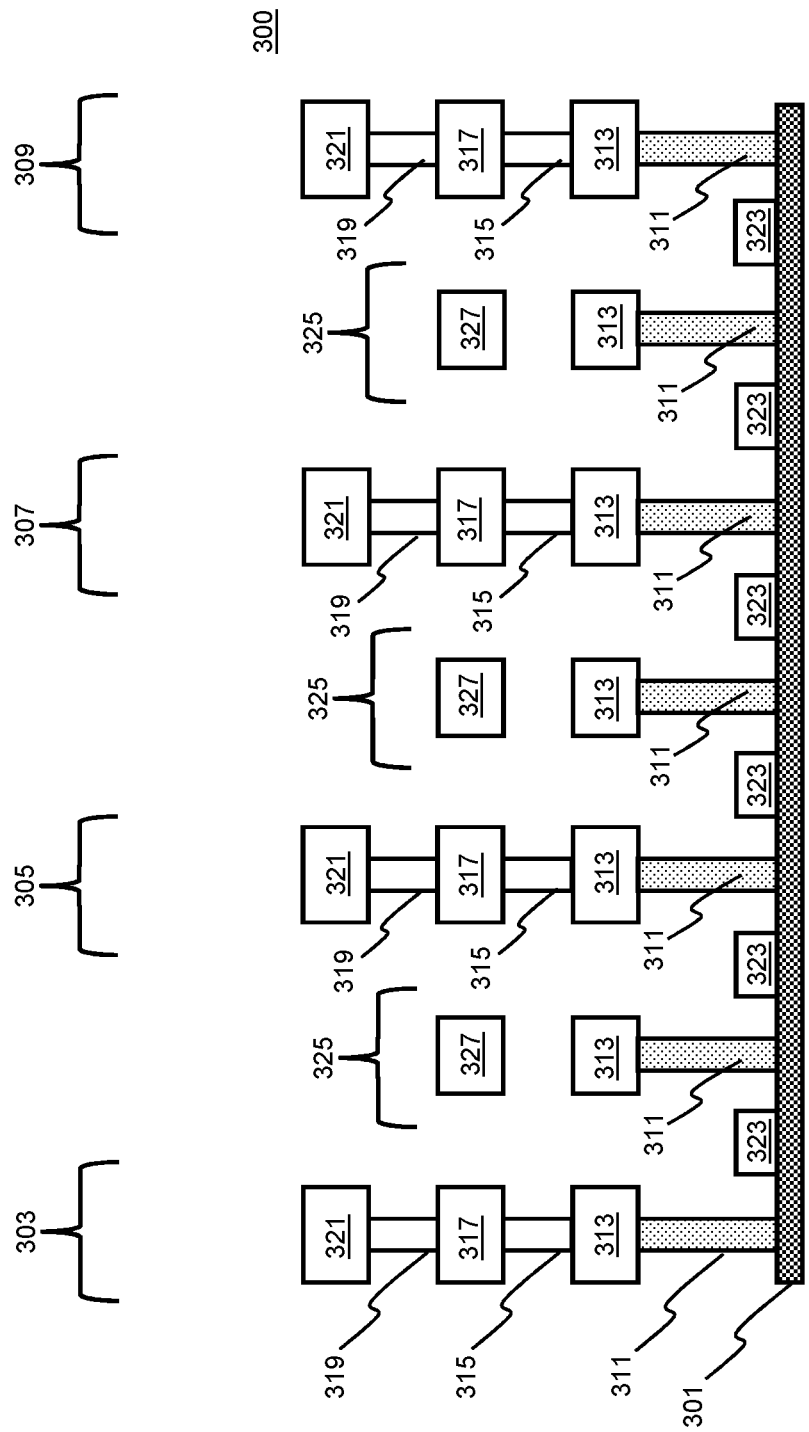
FIGS. 3 through 7 schematically illustrate cross-sectional views of a process flow for forming a 2 Gb (14 nm) integrated high-density 3D STT-MRAM structure with a 3D array of multi-level MTJ interconnect structures, in accordance with an exemplary embodiment.

FIGS. 3 through 6 schematically illustrate cross-sectional views of a process flow for forming a 2 Gb (14 nm) integrated high-density 3D STT-MRAM structure with a 3D array of multi-level MTJ interconnect structures, in accordance with an exemplary embodiment. Referring to FIG. 3, a Si substrate 301 of a STT-MRAM structure 300 is provided with an RX (not shown for illustrative convenience) and an array of interconnect structures 303, 305, 307, and 309. In this instance, a bottom portion of each interconnect structure 303, 305, 307, and 309 includes a CA 311, a metal layer 313 (M1), a via 315 (V1), a metal layer 317 (M2), a via 319 (V2), and a metal layer 321 (M3). The Si substrate 301 is also provided with a pair of WL 323 over the Si substrate 301 between a pair of interconnect structures, e.g., 303 and 305, a transistor common 325, and a WL contact 327, e.g., WL2, WL1, WL0. In one instance, the interconnect stacks 303 and 305 may be formed over positive n-type (N+) drains and the transistor common 325 may be formed over a N+ shared source (both not shown for illustrative convenience). The metal layers 313, 317, and 321, the vias 315 and 319, and the WL contact 327 may be formed, e.g., of Cu, W, or Co.

Figure 4:
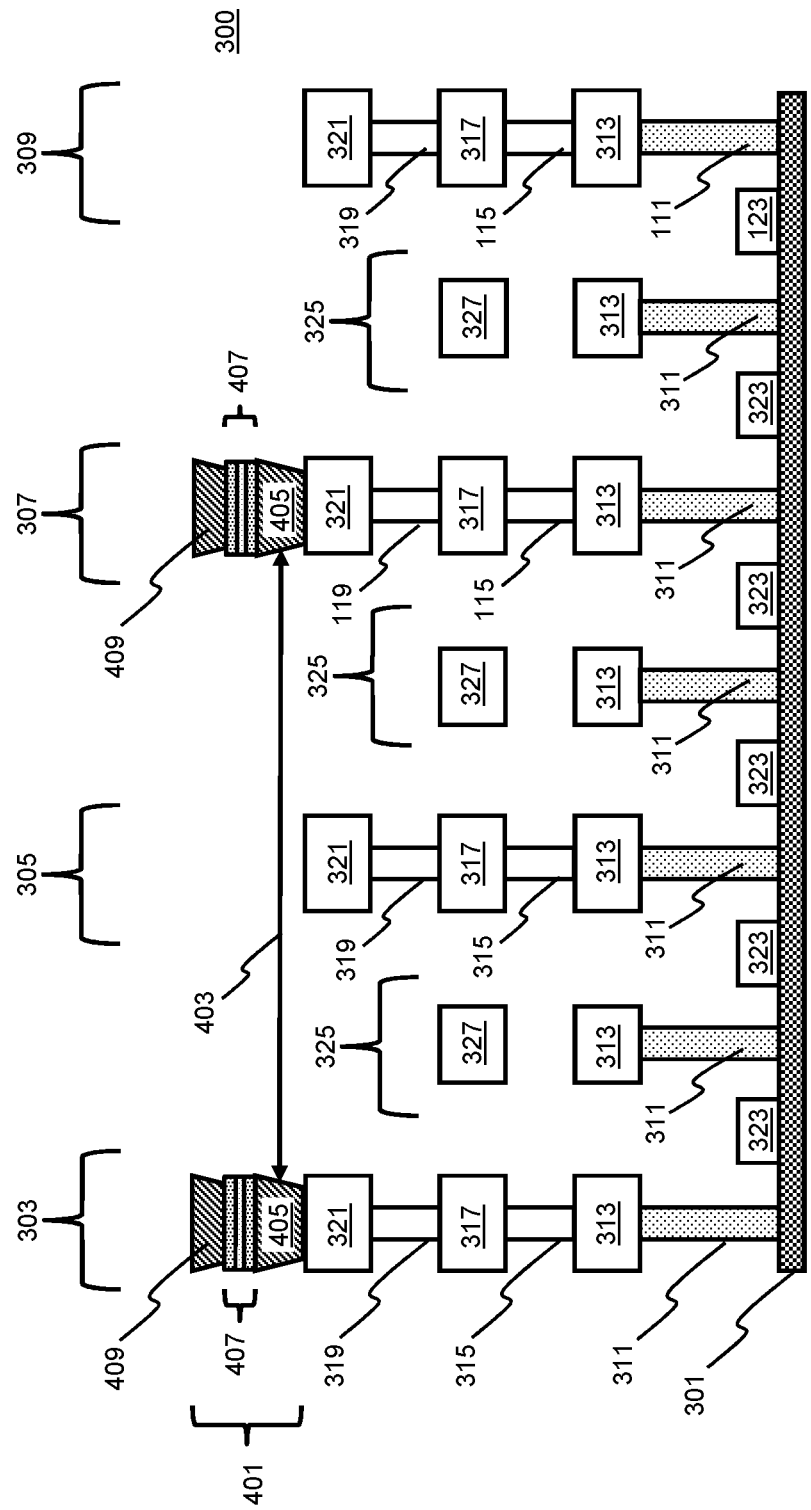
Figure 5:
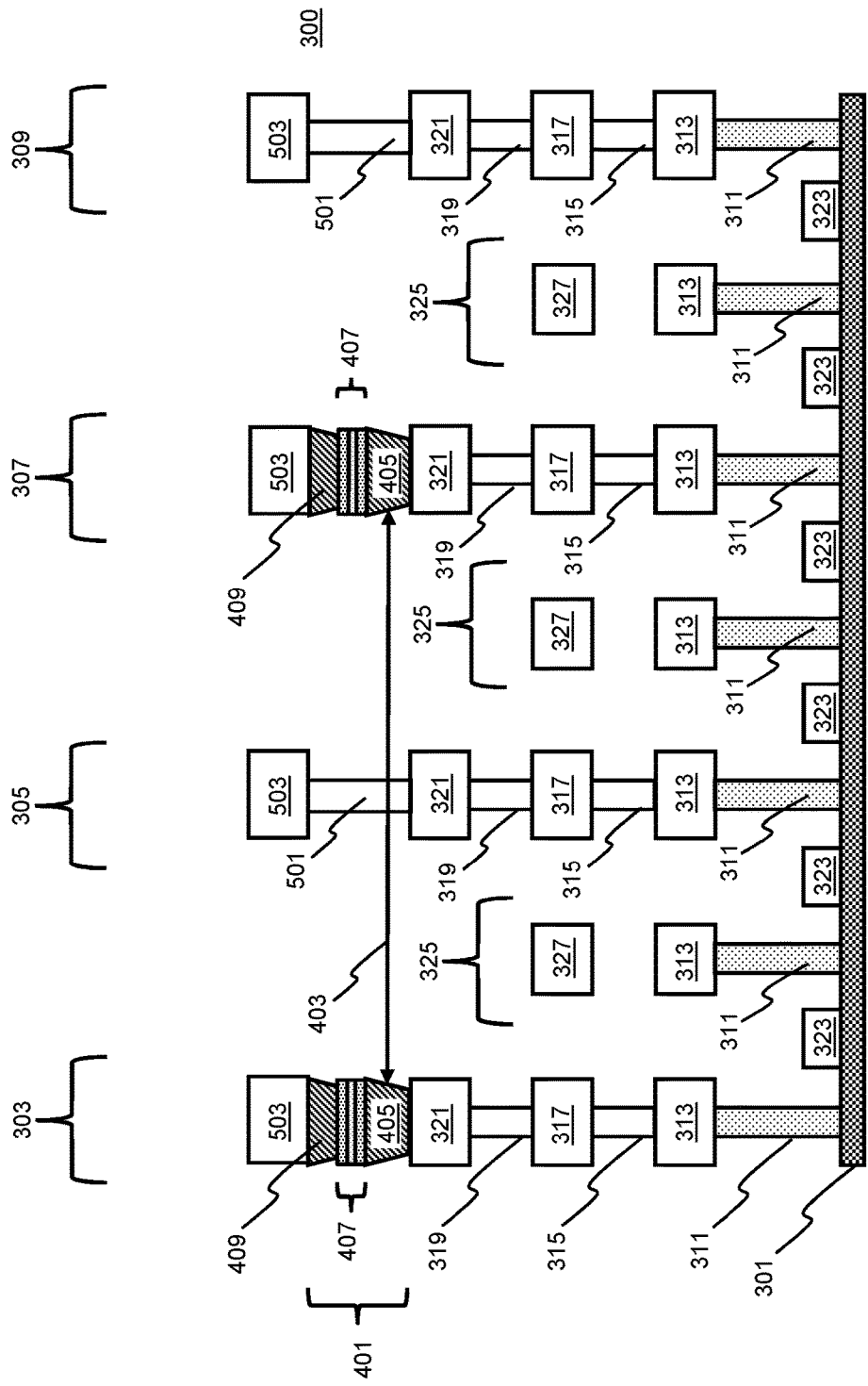

Referring to FIG. 4, a MTJ structure 401 is formed on each of the interconnect stacks 303 and 307. Each MTJ structure 401 includes, e.g., a bottom via 405, a MTJ stack 407, and a top via 409. The bottom via 405 and the top via 409 may be formed, e.g., of Cu, W, or Co. In this instance, the density (X) of the STT-MRAM 300 is 2 Gb (14 nm). Therefore, the MTJ stack 407 P (as depicted by the arrow 403) is equal to the distance between two interconnect stacks separated by X−1 interconnect stacks. A via 501 with a height of the MTJ structure 401 is then formed on each interconnect stack without a MTJ structure 401, e.g., interconnect stacks 305 and 309, and a metal layer 503 is formed on each MTJ structure 401 and via 501, as depicted in FIG. 5.

Figure 1:
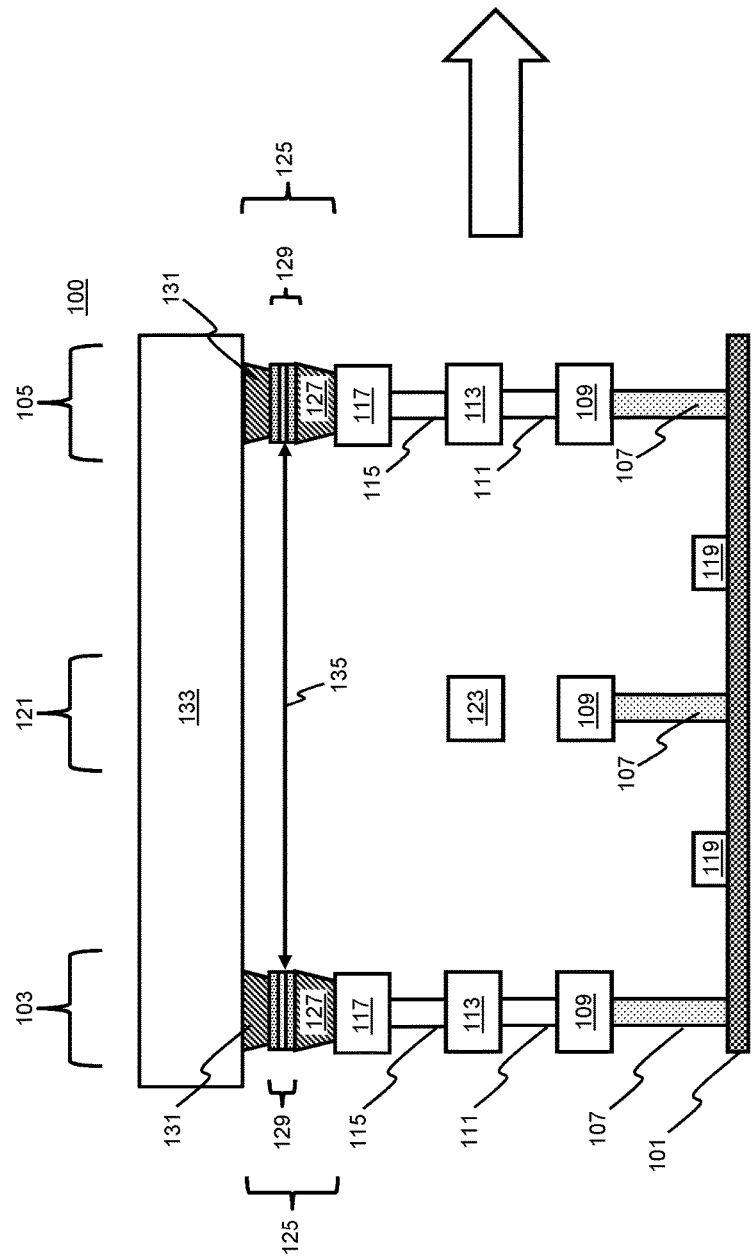
FIG. 1 schematically illustrates a background 1 GB (28 nm) STT-MRAM structure.
Figure 2:
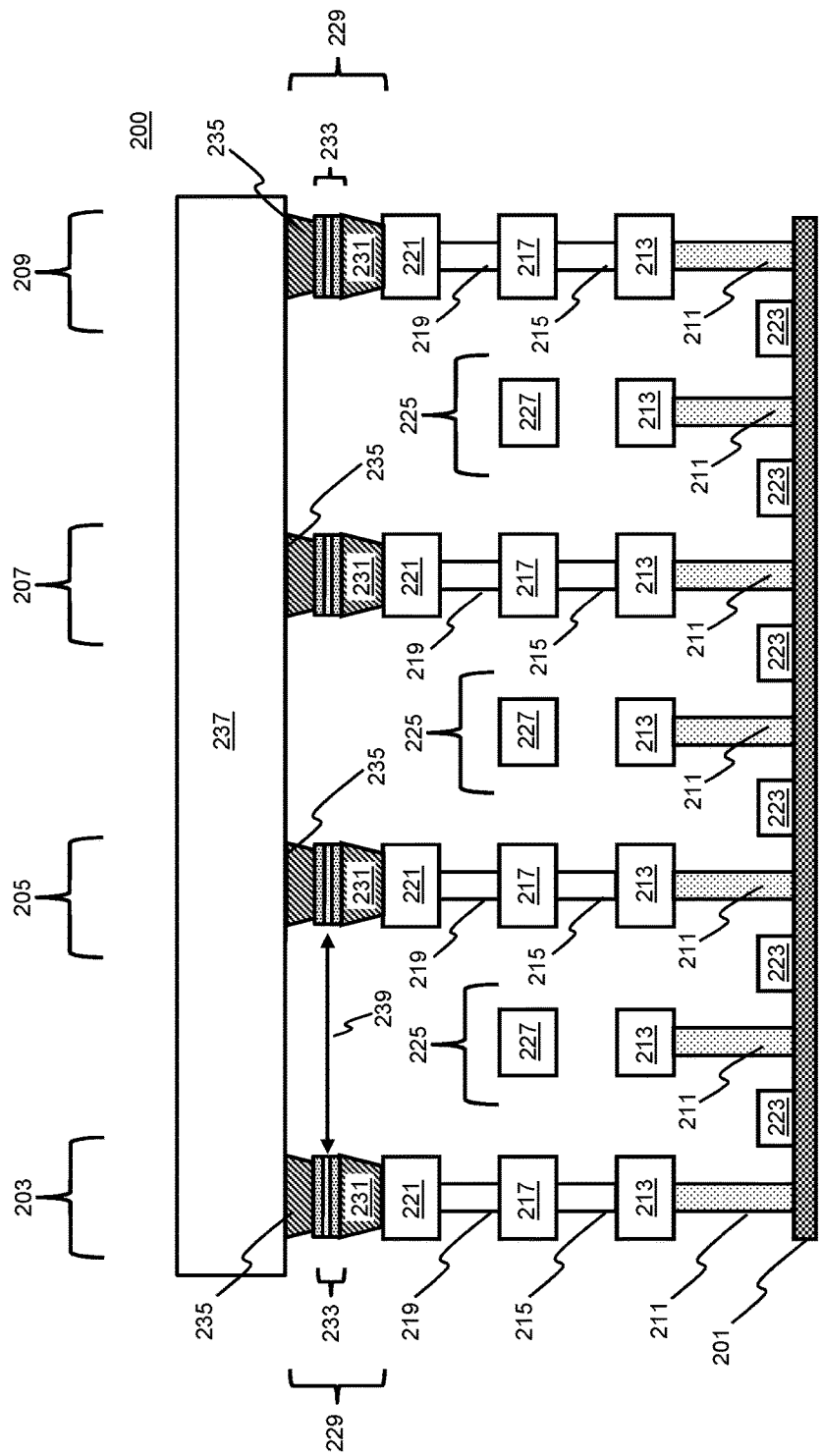
FIG. 2 schematically illustrates the background STT-MRAM structure of FIG. 1 scaled to a 2 Gb (14 nm) STT-MRAM structure.
Figure 6:
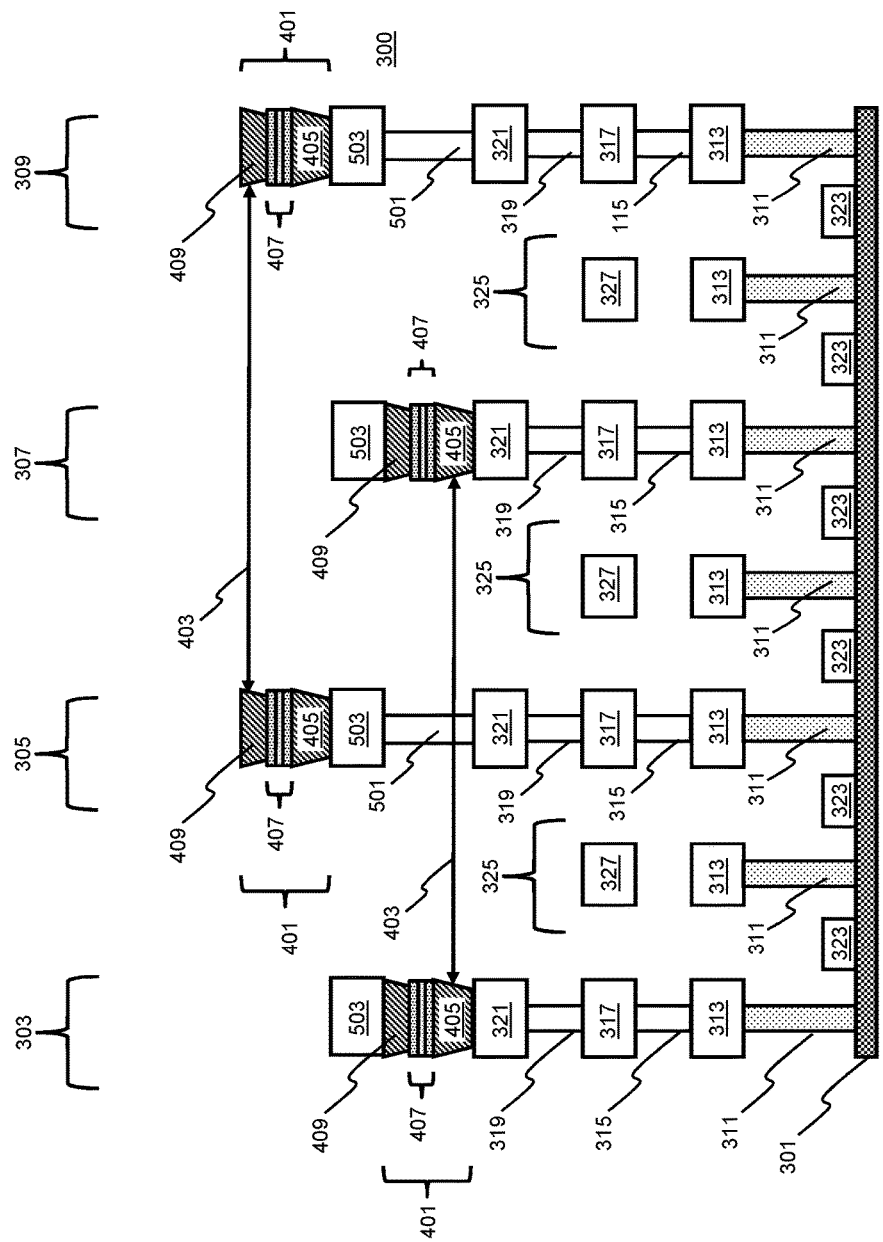
Figure 7:
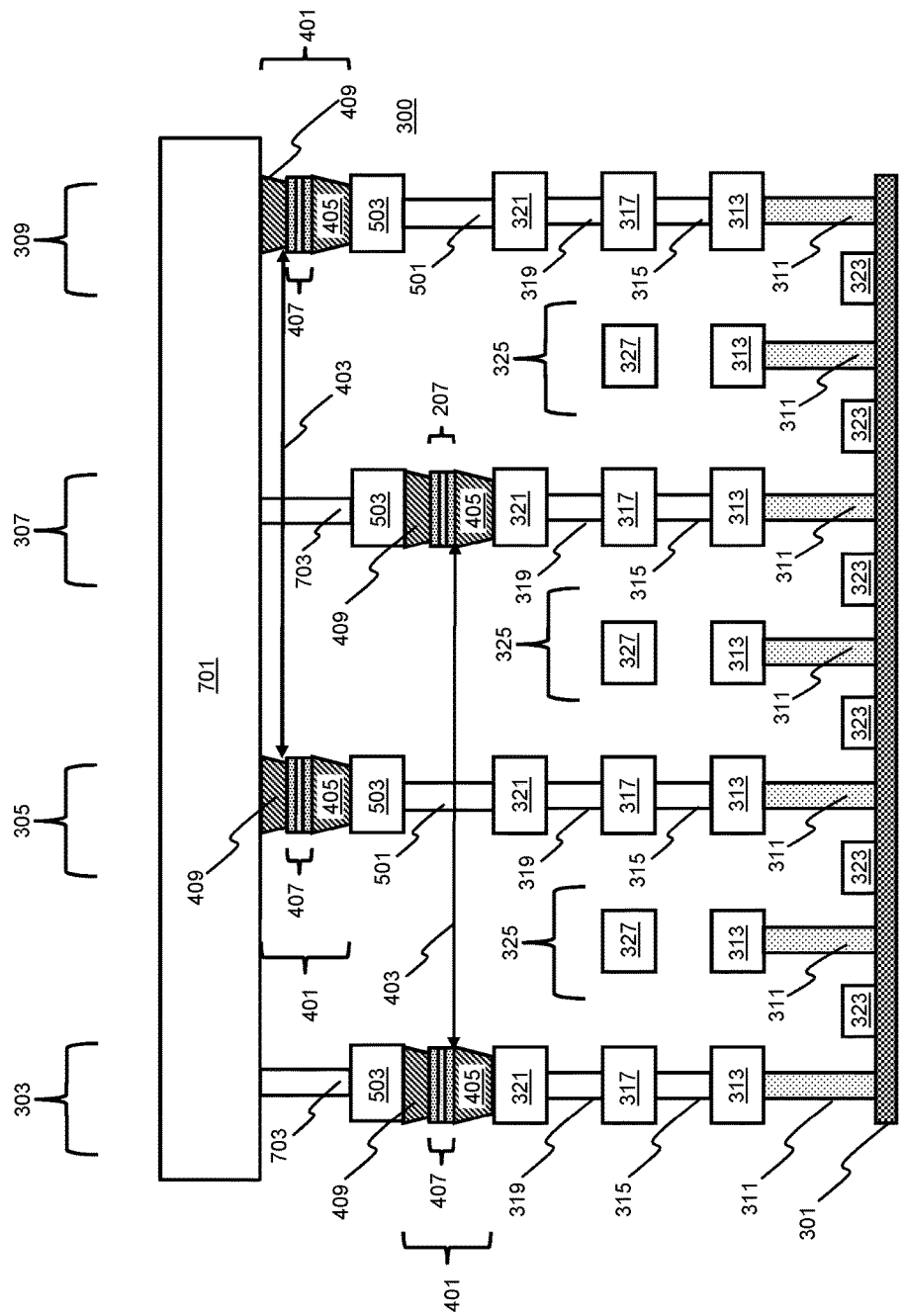

Thereafter, the forming of the MTJ structure 401, the via 501, and the metal layer 503 is repeated one interconnect structure laterally shifted (305) while maintaining the same P 403 until the level of the MTJ structure 401 equal the X-density of the STT-MRAM structure 300, as depicted in FIG. 6. In this instance, only 2 levels of MTJ structures 401 are required. Referring to FIG. 7, a bit line 701 is formed over the Si substrate 301 and a via 703 is formed, e.g., of Cu, W, or Co, between the bit line 701 and the metal layer 503, connecting the bit line 701 with each MTJ structure 401. Consequently, whereas the known solution described above with respect to FIGS. 1 and 2 divides the MTJ stack P in half (P/2) when scaling between a 1 Gb (28 nm) STT-MRAM structure (FIG. 1) and 2 Gb (14 nm) STT-MRAM structure (FIG. 2), the resultant 2 Gb (14 nm) STT-MRAM structure of FIG. 7 maintains the same P as the 1 Gb (28 nm) STT-MRAM structure of FIG. 1.

FIGS. 8 through 13 schematically illustrate cross-sectional views of a process flow for forming a 4 Gb 7 nm integrated high-density 3D STT-MRAM structure with a 3D array of multi-level MTJ interconnect structures, in accordance with an exemplary embodiment. The process flow described with respect to FIGS. 8 through 13 is almost identical to the process flow described with respect to FIGS. 3 through 7 because the process flow may be scaled without modifying the MTJ stack P. The only difference is that the density of the STT-MRAM is greater in this instance than the density of the STT-MRAM of FIGS. 3 through 7, e.g., 4 Gb (7 nm) vs. 2 Gb (14 nm), and, therefore, the number of levels of the MTJ structures must be increased accordingly, e.g., 4 levels vs. 2 levels.

Figure 8:
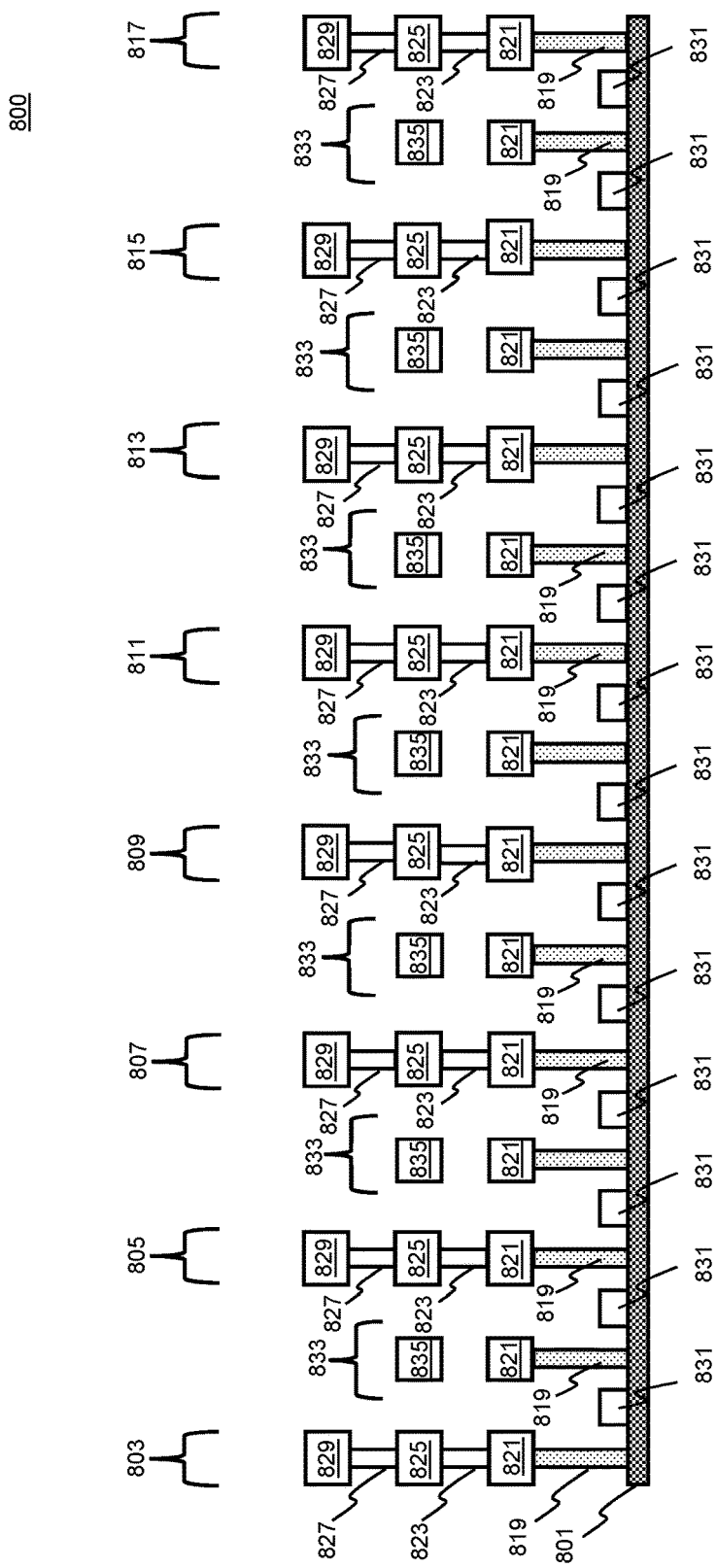
FIGS. 8 through 13 schematically illustrate cross-sectional views of a process flow for forming a 4 Gb (7 nm) integrated high-density 3D STT-MRAM structure with a 3D array of multi-level MTJ interconnect structures, in accordance with an exemplary embodiment.

Referring to FIG. 8, a Si substrate 801 of a STT-MRAM structure 800 is provided with an RX (not shown for illustrative convenience) and an array of interconnect structures 803, 805, 807, 809, 811, 813, 815, and 817. Similar to the device of FIG. 3, a bottom portion of each interconnect structure 803, 805, 807, 809, 811, 813, 815, and 817 may include a CA 819, a metal layer 821 (M1), a via 823 (V1), a metal layer 825 (M2), a via 827 (V2), and a metal layer 829

(M3). The Si substrate 801 is also provided with a pair of WL 831 between a pair of interconnect structures, e.g., 803 and 805, over the Si substrate 601, a transistor common 833, and a WL contact 835, e.g., WL2, WL1, WL0, etc. In one instance, the interconnect stack, e.g., 803, may be formed over N+ drains and the transistor common 833 may be formed over a N+ shared source (both not shown for illustrative convenience). The metal layers 821, 825, and 829, the vias 823 and 827, and the WL contact 831 may be formed, e.g., of Cu, W, or Co.

Figure 9:
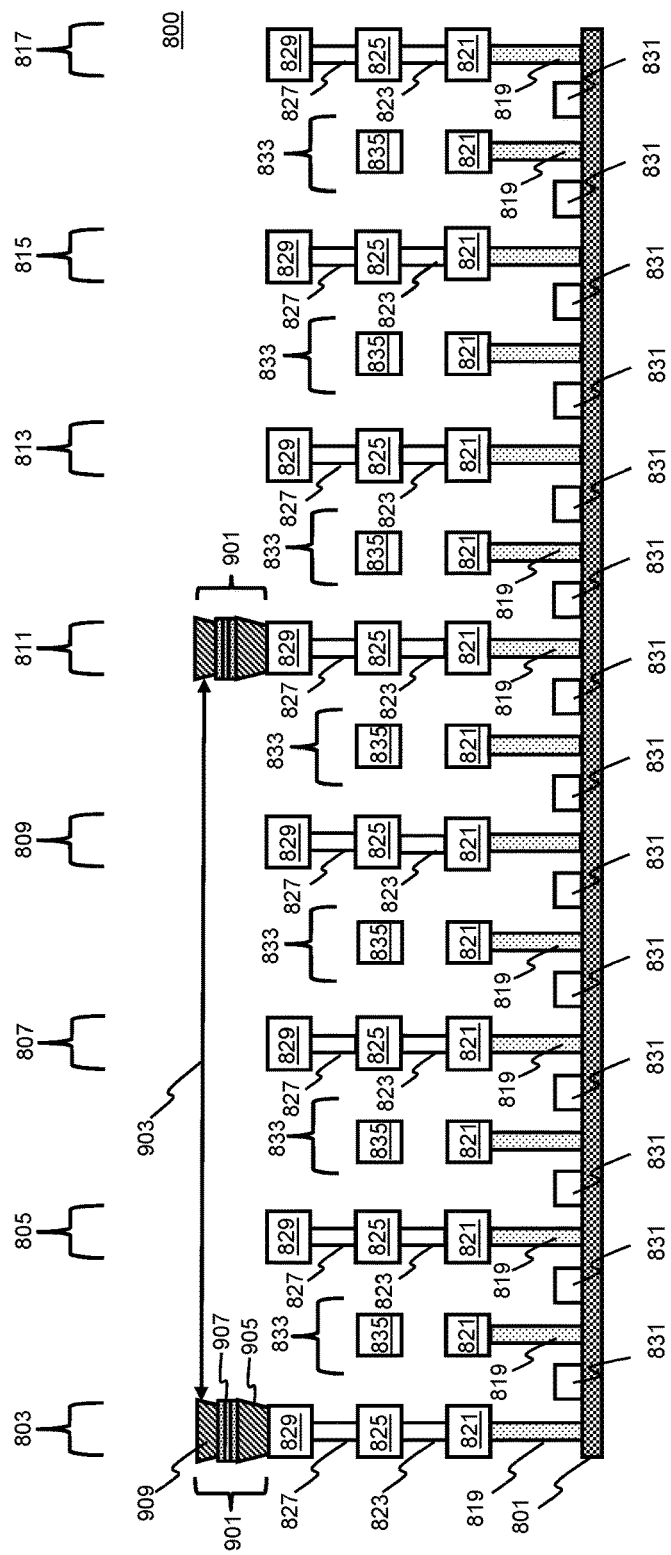

A MTJ structure 901 is formed on each of the interconnect stacks 803 and 811 (level 1), as depicted in FIG. 9. Each MTJ structure 901 includes, e.g., a bottom via 905, a MTJ stack 907, and a top via 909. The bottom via 905 and the top via 909 may be formed, e.g., of Cu, W, or Co. In this instance, the density (X) of the STT-MRAM structure 800 is 4 Gb (7 nm). Therefore, the MTJ stack 907 P (as depicted by the arrow 903) is equal to the distance between two interconnect stacks separated by X−1 interconnect stacks. A via 1001 with a height of the MTJ structure 901 is then formed on each interconnect stack without a MTJ structure 901, e.g., interconnect stacks 805, 807, 809, 813, 815, and 817 and a metal layer 1003 is formed on each MTJ structure 901 and via 1001, as depicted in FIG. 10.

Figure 10:
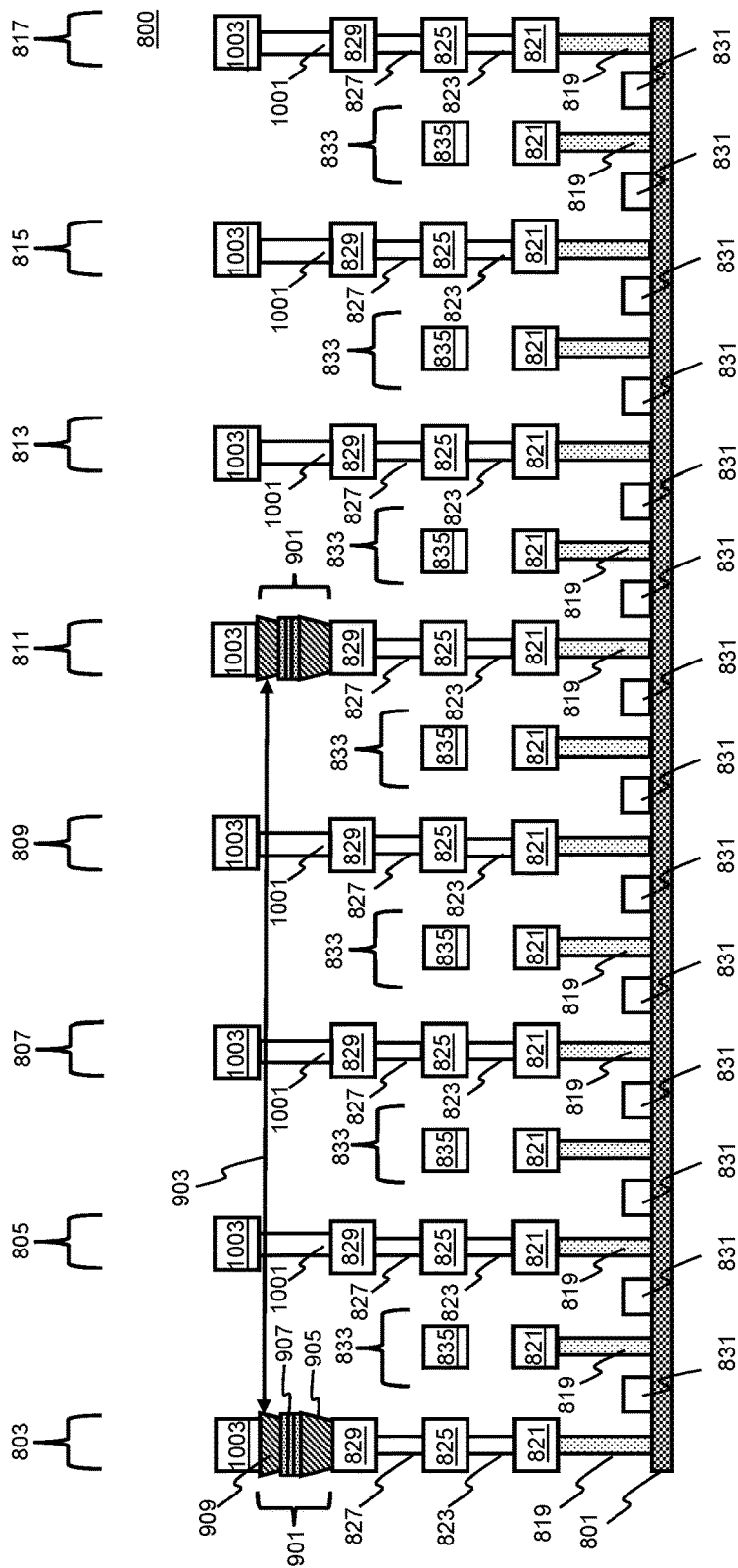
Figure 11:
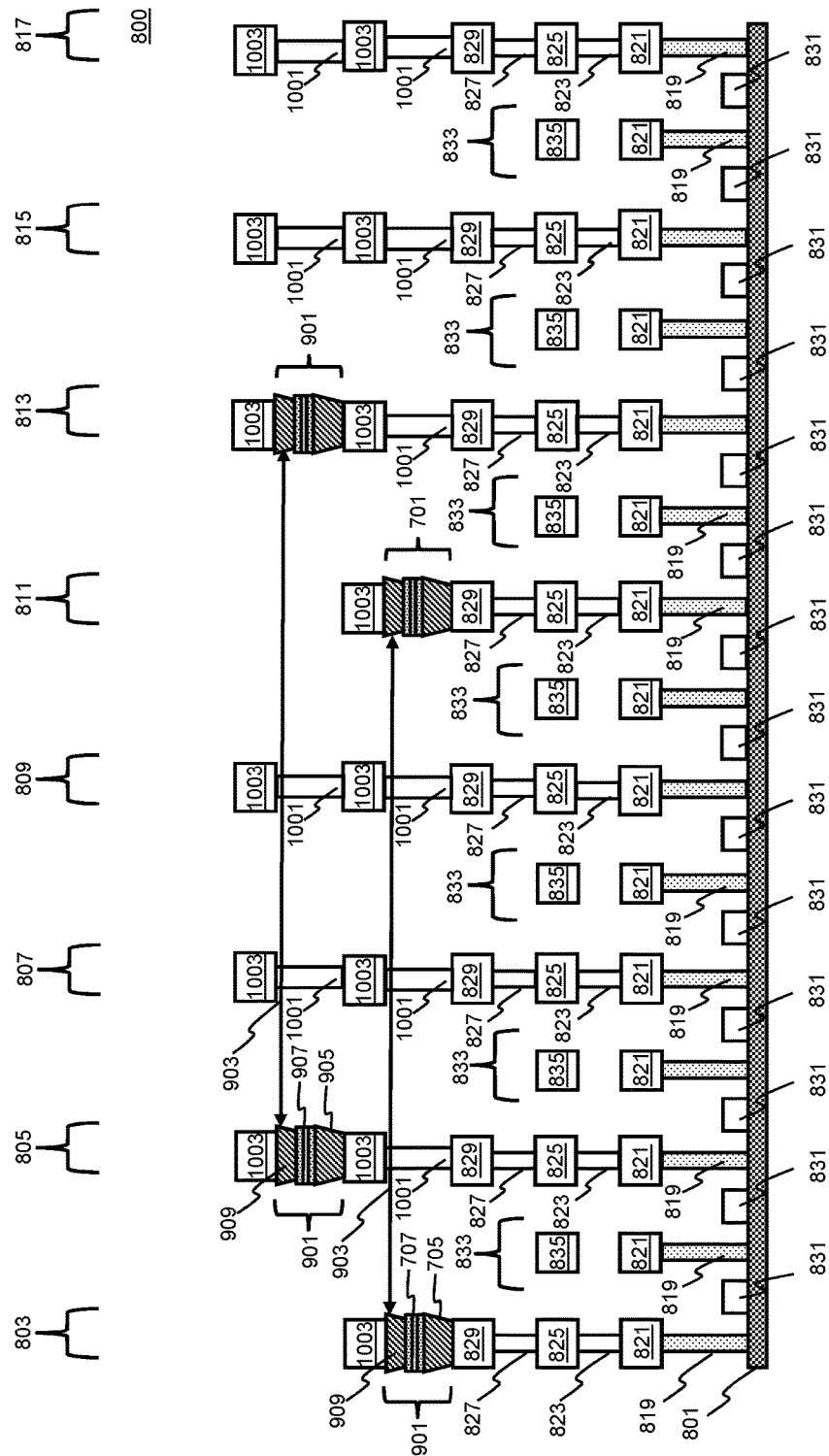
Figure 14A:
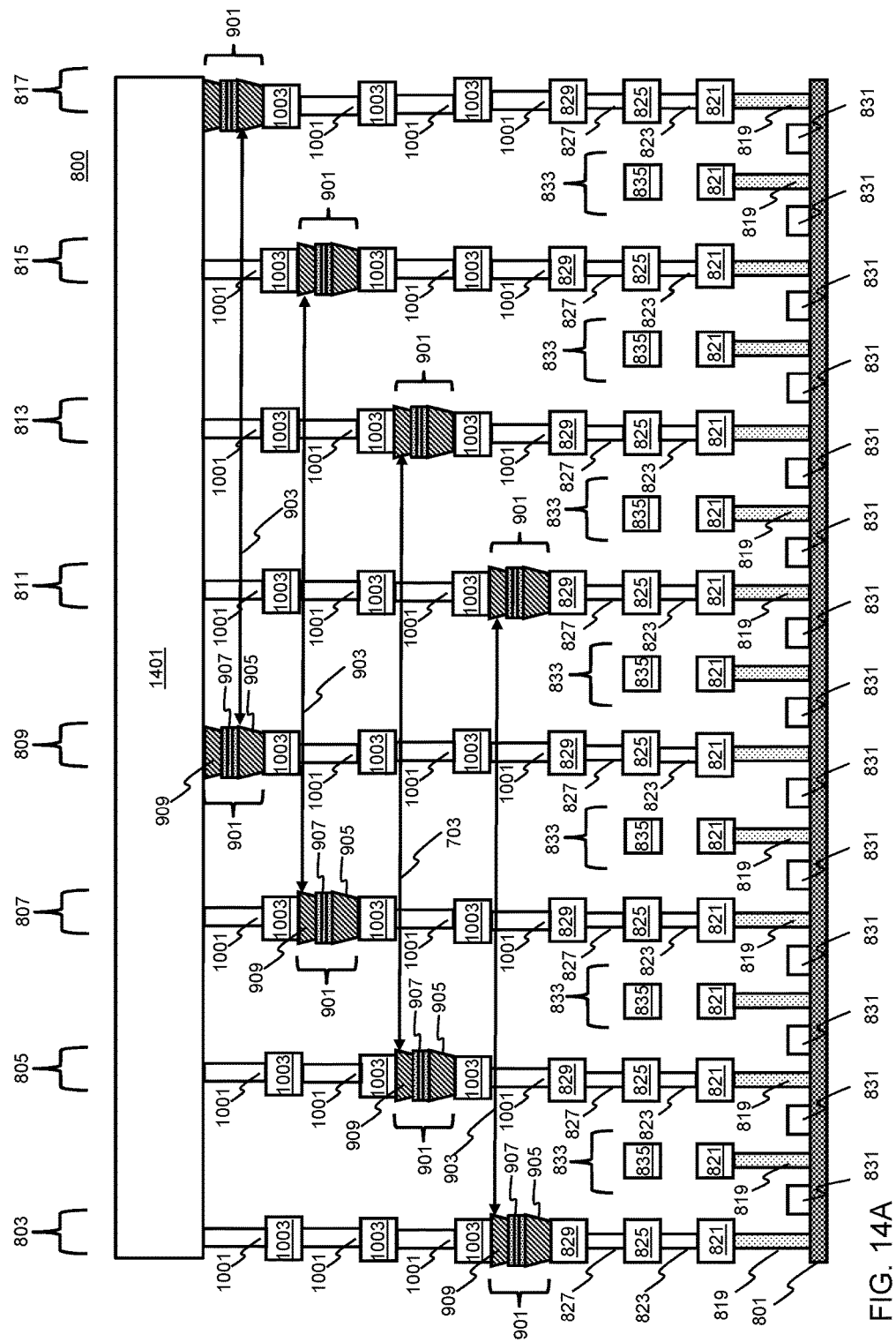
FIGS. 14A and 14B schematically illustrate cross-sectional views of the resultant 3D STT-MRAM structure of FIGS. 8 through 13, in accordance with an exemplary embodiment.

Referring to FIG. 11, the forming of the MTJ structure 901, the via 1001, and the metal layer 1003 as described with respect to FIG. 10 is repeated laterally shifted one interconnect stack such that the next level of MTJ structures 901 (level 2) is formed on the interconnect stacks 805 and 813. In one instance, a via 1001 and a metal layer 1003 may also be formed on the metal layer 1003 of the interconnect stacks 803 and 811, as depicted in FIG. 14A. Alternatively, the top of the interconnect stacks 803 and 811 (above the metal layer 1003) may remain open until the subsequent formation of a through via contact, as depicted in FIG. 14B.

Figure 12:
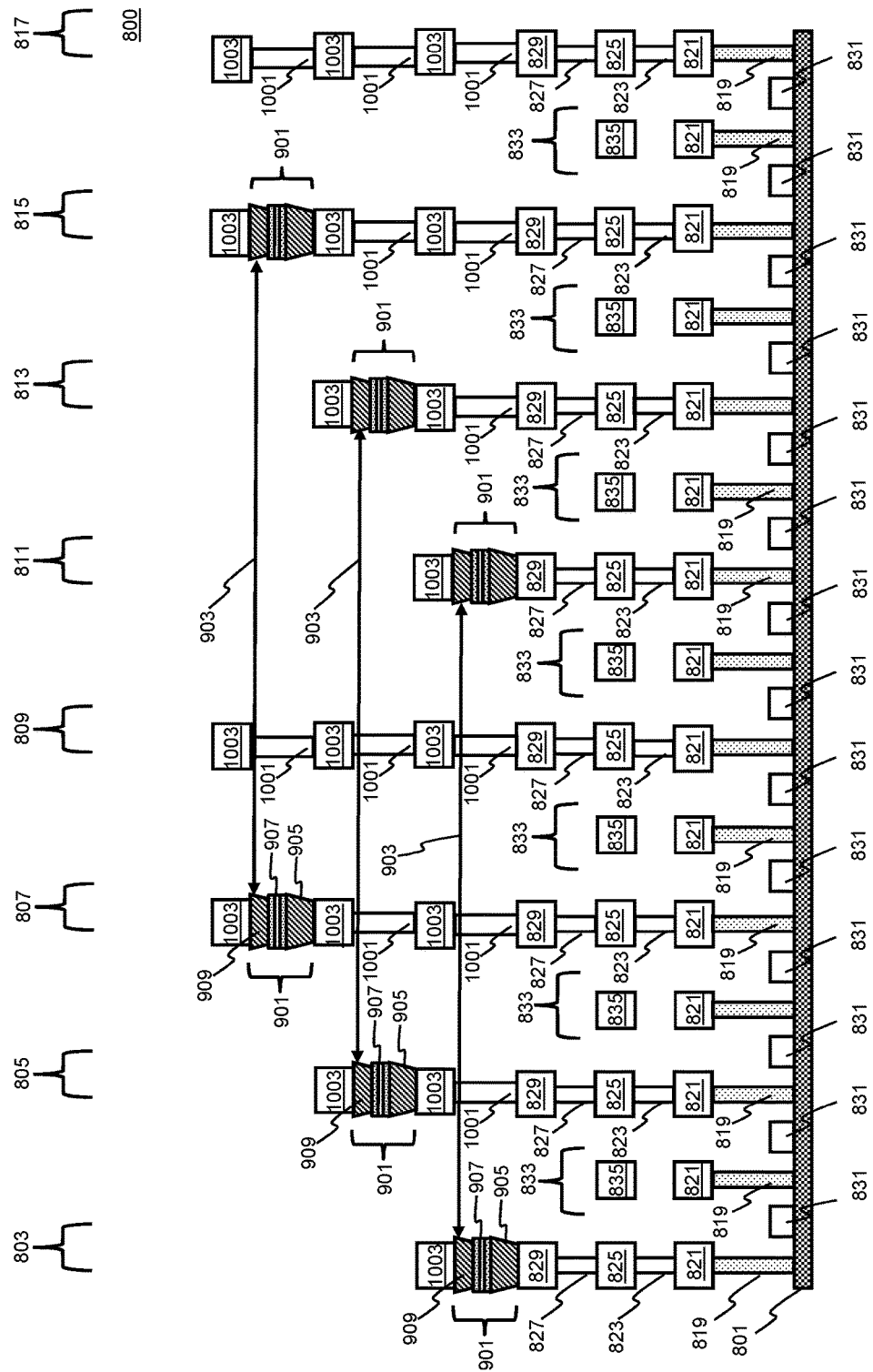

As described above, the forming of the MTJ structure 901, the via 1001, and the metal layer 1003 is repeated laterally shifted one interconnect stack until the level of the MTJ structure 901 equals the X-density of the STT-MRAM structure 800, e.g., 4 Gb. Therefore, the forming of the MTJ structure 901, the via 1001, and the metal layer 1003 as described with respect to FIG. 10 is once again repeated laterally shifted one interconnect stack such that the next level (level 3) of MTJ structures 901 is formed on the interconnect stacks 807 and 815, as depicted in FIG. 12. In one instance, a via 1001 and a metal layer 1003 may also be formed on the metal layer 1003 of the interconnect stacks 803, 805, 811, and 813, as depicted in FIG. 14A. Alternatively, the top of the interconnect stacks 803, 805, 811, and 813 (above the metal layer 1003) may remain open until the subsequent formation of a through via contact, as depicted in FIG. 14B.

Figure 13:
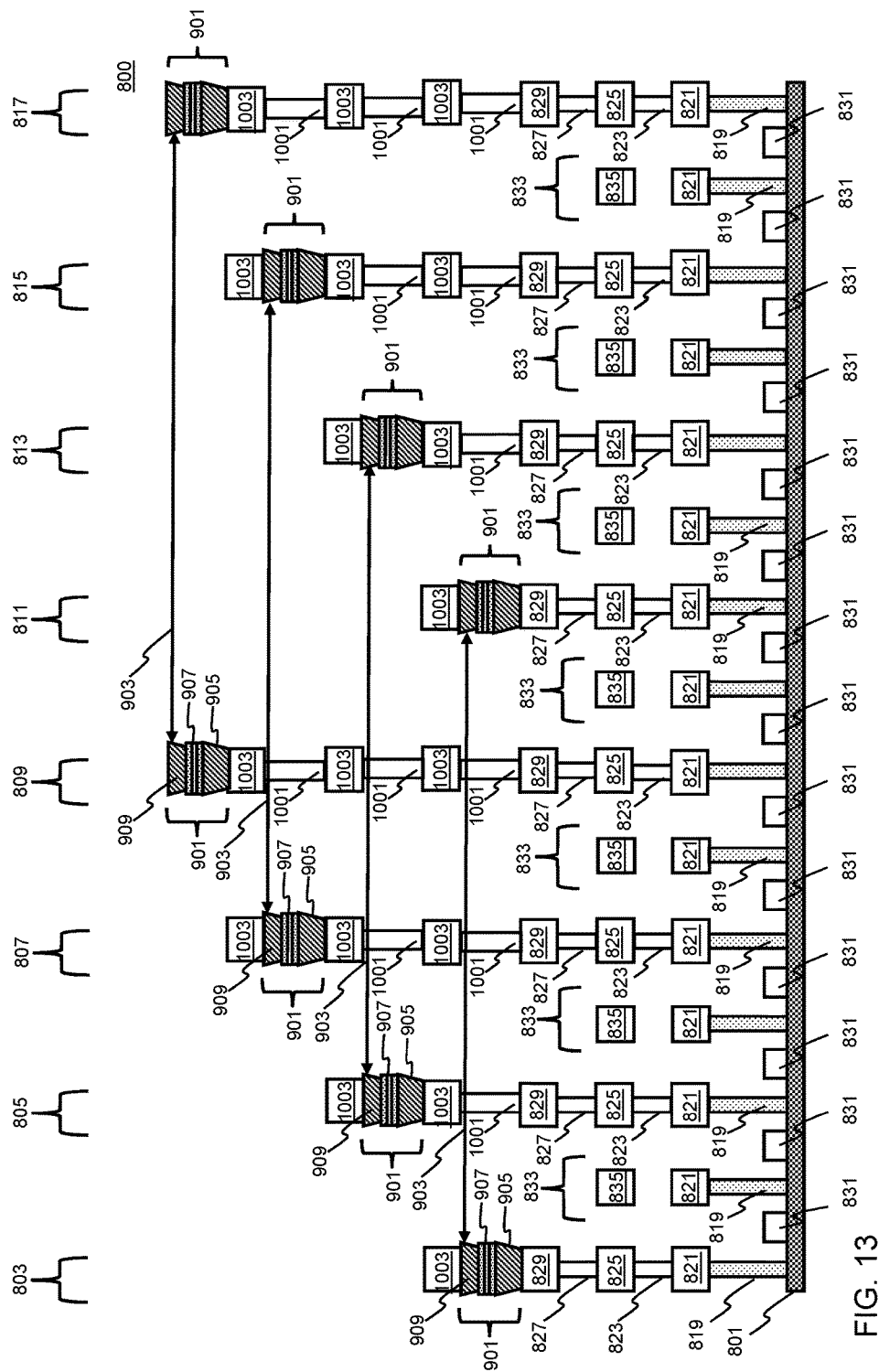

Referring to FIG. 13, the forming of the MTJ structure 901, the via 1001, and the metal layer 1003 as described with respect to FIG. 10 is further repeated laterally shifted one interconnect stack such that the next level of MTJ structures 901 (level 4) is formed on the interconnect stacks 809 and 817; however, in this instance, because there are now 4 levels of MTJ structures 901, only the MTJ structure 901 is formed at this level. In one instance, a via 1001 may be formed on the metal layer 1003 of the interconnect stacks 803, 805, 807, 811, 813, and 815, as depicted in FIG. 14A. Alternatively, the top of the interconnect stacks 803, 805, 807, 811, 813, and 815 (above the metal layer 1003) may remain open until the subsequent formation of a through via contact, as depicted in FIG. 14B.

Figure 14B:
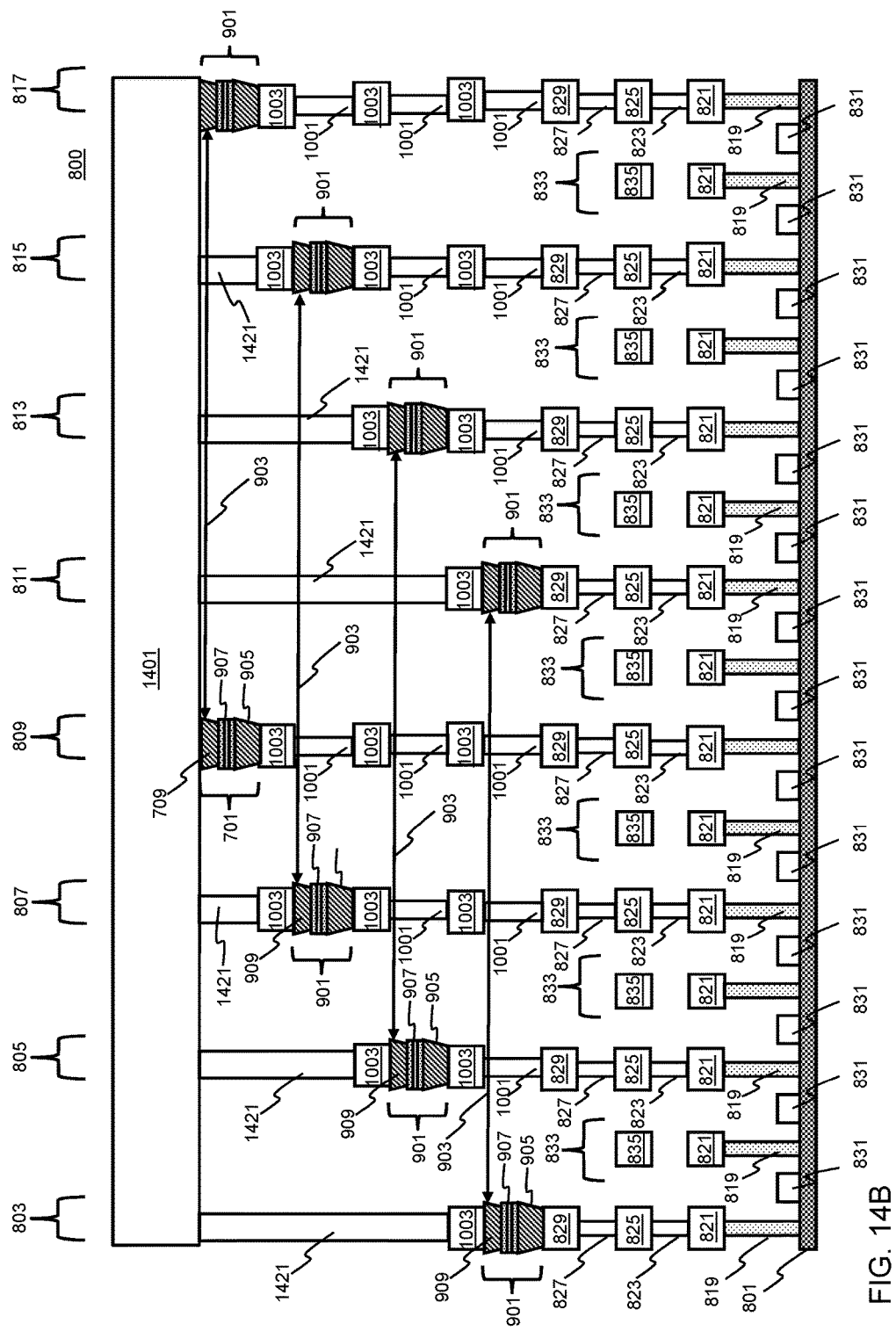

FIGS. 14A and 14B schematically illustrate cross-sectional views of the resultant 3D STT-MRAM structure of FIGS. 8 through 13, in accordance with an exemplary embodiment. Referring to FIG. 14A, in one instance, as partially described above, the forming of the via 1001 and the metal layer 1003 is repeated in synch with the formation of each level of MTJ structures 901 until a via 1001 is formed on each interconnect structure on the same level as the last level of MTJ structures 901, e.g., level 4. Consequently, 3 vias 1001 and 2 metal layers 1003 would be formed on each of the interconnect stacks 803 and 811; 2 vias 1001 and 1 metal layer 1003 would be formed on each of the interconnect stacks 805 and 813, and 1 via 1001 would be formed on each of the interconnect stacks 807 and 815. The bit line 1401 is then formed over the substrate 801 and on the vias 1001 and MTJ structures 901 (level 4) connecting the bit line 1401 to each MTJ structure 901.

Alternatively, as partially described above, a through via contact 1421 can be formed on the metal layer 1003 of each of the interconnect stacks 803, 805, 807, 811, 813, and 815 up to an upper surface of the MTJ structure 901 on the last level of the MTJ structures 901, e.g., level 4, as depicted in FIG. 14B. Thereafter, the bit line 1401 is formed over the substrate 801 and on the through via contacts 1221 and the MTJ structures 901 (level 4) connecting the bit line 1401 to each MTJ structure 901. Consequently, although the density of the resultant STT-MRAM structure of FIG. 7 was scaled from 2 Gb (14 nm) to 4 Gb (7 m) in FIGS. 14A and 14B, the MTJ stack P remained the same.

The embodiments of the present disclosure can achieve several technical effects including forming an integrated high-density STT-MRAM with a 3D array of multi-level MTJ interconnect structures, mitigating process issues such as MTJ pitch scaling limitation, etching, patterning, and dielectric gap-fill issues, etc. associated with known solutions, a faster time to market, and eliminating the need for new tools. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including STT-MRAM.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a silicon (Si) substrate of an X-density spin-transfer torque magnetoresistive random access memory (STT-MRAM) having an array of interconnect stacks;
   forming a level of a metal tunnel junction (MTJ) structure on each of a first interconnect stack and a second interconnect stack, wherein (X−1) defines a number of interconnect stacks between the first interconnect stack and the second interconnect stack;

forming a via with a height of the MTJ structure on each interconnect stack without a MTJ structure;
    forming a metal layer on each MTJ structure and via on the level;
    repeating the forming of the MTJ structure, the via, and the metal layer one interconnect stack laterally shifted until the level of the MTJ structure equals X, only forming the MTJ structure at that level;
    forming a bit line over the substrate; and
    connecting the bit line to each MTJ structure.

2. The method according to claim 1, comprising forming the MTJ structure by:
    forming a bottom via on each of the first interconnect stack and the second interconnect stack;
    forming a MTJ stack on the bottom via; and
    forming a top via on the MTJ stack.

3. The method according to claim 2, comprising forming the bottom via, the top via, the via, and the metal layer of copper (Cu), tungsten (W), or cobalt (Co).

4. The method according to claim 1, comprising connecting the bit line to each MTJ structure by:
    forming a second via of Cu, W, or Co between the bit line and the metal layer.

5. The method according to claim 1, comprising connecting the bit line to each MTJ structure by:
    forming a second via of Cu, W, or Co with a height of the MTJ structure on each metal layer;
    forming a second metal layer of Cu, W, or Co on each second via; and
    repeating the forming of the second via and the second metal layer until each second via is on the level of the MTJ structure that equals X, only forming the second via at that level.

6. The method according to claim 1, comprising connecting the bit line to each MTJ structure by:
    forming a through via contact of Cu, W, or Co between each metal layer and the bit line.

7. A device comprising:
    an array of interconnect stacks, laterally separated, over a silicon (Si) substrate of a spin-transfer torque magnetoresistive random access memory (STT-MRAM);
    a first metal tunnel junction (MTJ) structure on each of a first interconnect stack and a second interconnect stack, wherein the first interconnect stack and the second interconnect stack are separated by a third interconnect stack;
    a via with a height of the first MTJ structure on each of the third interconnect stack and a fourth interconnect stack, wherein the third interconnect stack and the fourth interconnect stack are separated by the second interconnect stack;
    a metal layer on each first MTJ structure and via;
    a second MTJ structure on the metal layer of each of the third interconnect stack and the fourth interconnect stack, wherein the third interconnect stack and the fourth interconnect stack are separated by the second interconnect stack;
    a second via with a height of the second MTJ structure on the metal layer of each of the first interconnect stack and the second interconnect stack; and
    a bit line over the substrate and on the second via and the second MTJ structure.

8. The device according to claim 7, further comprising:
    a pair of word lines, laterally separated, over the Si substrate between a pair of interconnect stacks of the array;
    a transistor common over the Si substrate between the pair of word lines; and
    a word line contact over the transistor common.

9. The device according to claim 7, wherein a bottom portion of the interconnect stack comprises:
    a source/drain contact (CA) over the substrate;
    a second metal layer over the CA;
    a third via over the second metal layer;
    a third metal layer over the third via;
    a fourth via over the third metal layer; and
    a fourth metal layer over the fourth via.

10. The device according to claim 9, wherein the first MTJ structure and the second MTJ structure each comprise:
    a bottom via on the fourth metal layer of each of the first interconnect stack and the second interconnect stack and on the metal layer of each of the third interconnect stack and the fourth interconnect stack, respectively;
    a MTJ stack on the bottom via; and
    a top via on the MTJ stack.

11. The device according to claim 10, wherein the via, the metal layer, the second via, the second metal layer, the third via, the third metal layer, the fourth via, the fourth metal layer, the bottom via, and the top via comprise copper (Cu), tungsten (W), or cobalt (Co).

12. The device according to claim 7, wherein the device comprises a 2 gigabit (2 Gb) integrated high-density three dimensional (3D) STT-MRAM structure with a 3D array of multi-level MTJ interconnect structures.

13. A device comprising:
    an array of a first interconnect stack through an eighth interconnect stack, laterally separated, over a silicon (Si) substrate of a spin-transfer torque magnetoresistive random access memory (STT-MRAM);
    a first metal tunnel junction (MTJ) structure on each of the first interconnect stack and the fifth interconnect stack;
    a first via with a height of the first MTJ structure on each of a second interconnect stack, a third interconnect stack, a fourth interconnect stack, a sixth interconnect stack, a seventh interconnect stack, and the eighth interconnect stack;
    a first metal layer on each first MTJ structure and first via;
    a second MTJ structure on the first metal layer of each of the second interconnect stack and the sixth interconnect stack;
    a second via with a height of the second MTJ structure on each of the third interconnect stack, the fourth interconnect stack, the seventh interconnect stack, and the eighth interconnect stack;
    a second metal layer on each second MTJ structure and second via;
    a third MTJ structure on the second metal layer of each of the third interconnect stack and the seventh interconnect stack;
    a third via with a height of the third MTJ structure on each of the fourth interconnect stack and the eighth interconnect stack;
    a third metal layer on each third MTJ structure and third via;
    a fourth MTJ structure on the third metal layer of each of the fourth interconnect stack and the eighth interconnect stack; and
    a bit line over the substrate and on to the fourth pair of MTJ structures.

14. The device according to claim 13, further comprising:
    a pair of word lines, laterally separated, over the Si substrate between a pair of interconnect stacks of the array;

a transistor common over the Si substrate between the pair of word lines; and
a word line contact over the transistor common.

15. The device according to claim 13, wherein a bottom portion of the interconnect stack further comprises:
a source/drain contact (CA) over the substrate;
a fourth metal layer over the CA;
a fourth via over the fourth metal layer;
a fifth metal layer over the fourth via;
a sixth via over the fifth metal layer; and
a six metal layer over the six via.

16. The device according to claim 15, wherein each of the first MTJ structure, the second MTJ structure, the third MTJ structure, and the fourth MTJ structure comprises:
a bottom via on the sixth metal layer, the first metal layer, the second metal layer, and the third metal layer, respectively;
a MTJ stack on the bottom via; and
a top via on the MTJ stack.

17. The device according to claim 16, wherein the first via, the first metal layer, the second via, the second metal layer, the third via, the third metal layer, the fourth via, the fourth metal layer, the fifth via, the fifth metal layer, the sixth via, the sixth metal layer, the bottom via, and the top via comprise copper (Cu), tungsten (W), or cobalt (Co).

18. The device according to claim 13, further comprising:
a fourth via with a height of the second MTJ structure on the first metal layer of each of the first interconnect stack and the fifth interconnect stack;
a fourth metal layer on the fourth via;
a fifth via with a height of the third MTJ structure on the fourth metal layer of each of the first interconnect stack and the fifth interconnect stack and on the second metal layer of each of the second interconnect stack and the sixth interconnect stack;
a fifth metal layer on the fifth via; and
a sixth via with a height of the fourth MTJ structure on the fifth metal layer of each of the first interconnect stack, the second interconnect stack, fifth interconnect stack, and sixth interconnect stack and on the third metal layer of each of the third interconnect stack, the fourth interconnect stack, and the seventh interconnect stack,
wherein the fourth via, the fourth metal layer, the fifth via, the fifth metal layer, and the sixth via comprise Cu, W, or Co.

19. The device according to claim 13, further comprising:
a through via contact on the first metal layer of each of the first interconnect stack and the fifth interconnect stack, on the second metal layer of each of the second interconnect stack and the sixth interconnect stack, and on the third metal layer of each of the third interconnect stack and the seventh interconnect stack,
wherein the through via contact comprise Cu, W, or Co.

20. The device according to claim 13, wherein the device comprises a 4 gigabit (4 Gb) integrated high-density three dimensional (3D) STT-MRAM structure with a 3D array of multi-level MTJ interconnect structures.

* * * * *